(12) United States Patent
Snidow

(10) Patent No.: US 9,136,412 B2
(45) Date of Patent: Sep. 15, 2015

(54) RECONFIGURABLE SOLAR PANEL

(71) Applicant: Scuint Corporation, Austin, TX (US)

(72) Inventor: Steven B Snidow, Austin, TX (US)

(73) Assignee: Scuint Corporation, Austin, TX (US)

( * ) Notice: Subject to any disclaimer, the term of this patent is extended or adjusted under 35 U.S.C. 154(b) by 141 days.

(21) Appl. No.: 13/792,186

(22) Filed: Mar. 10, 2013

(65) Prior Publication Data

US 2013/0263915 A1    Oct. 10, 2013

Related U.S. Application Data

(60) Provisional application No. 61/609,350, filed on Mar. 11, 2012.

(51) Int. Cl.
*H01L 31/042* (2014.01)
*H01L 31/048* (2014.01)
*H02S 30/10* (2014.01)

(52) U.S. Cl.
CPC .......... *H01L 31/0424* (2013.01); *H01L 31/048* (2013.01); *H02S 30/10* (2014.12); *Y02E 10/50* (2013.01)

(58) Field of Classification Search
CPC ...................................... H01L 31/042
USPC ........................ 136/244, 245, 251, 252, 259
See application file for complete search history.

(56) References Cited

U.S. PATENT DOCUMENTS

| | | |
|---|---|---|
| 6,617,505 B2 | 9/2003 | Shimada |
| 7,908,348 B2 | 3/2011 | Kumar et al. |
| 7,989,729 B1 | 8/2011 | Zhao et al. |
| 7,998,760 B2 | 8/2011 | Tabe |
| 2010/0018572 A1* | 1/2010 | Grimberg et al. ............. 136/252 |
| 2012/0152320 A1* | 6/2012 | Aguglia ....................... 136/248 |

FOREIGN PATENT DOCUMENTS

DE    202009008284 U1 * 10/2009

OTHER PUBLICATIONS

DE202009008284 U1, English equivalent of the abstract Oct. 2009.*
DE 202009008284 U1, Oct. 2009, Germany, Rooster Lighting Co Ltd, English equivalent of the abstract.*

* cited by examiner

*Primary Examiner* — Susan D Leong

(57) ABSTRACT

A reconfigurable solar panel that provides for the repair, replacement, modification and upgrade of various solar panel components.

4 Claims, 9 Drawing Sheets

PRIOR ART

RECONFIGURABLE SOLAR PANEL

CROSS-REFERENCE TO RELATED APPLICATIONS

This application claims the benefits of the filing of U.S. Provisional Patent Application Ser. No. 61/609,350 entitled, Reconfigurable Solar Panel, filed Mar. 11, 2012 and the specification thereof is incorporated herein by reference.

STATEMENT REGARDING FEDERALLY SPONSORED RESEARCH OR DEVELOPMENT

Not Applicable.

REFERENCE TO SEQUENCE LISTING, A TABLE, OR A COMPUTER PROGRAM LISTING COMPACT DISK APPENDIX

Not Applicable.

TECHNICAL FIELD

The present invention is in the technical field of photovoltaic (solar) devices. More particularly, the present invention is in the technical field of solar panels (photovoltaic panels) and solar panel repair and maintenance.

BACKGROUND OF THE INVENTION

Conventional design of solar panels are for each solar panel to be, essentially, comprised of a backing plate (substrate), an array of interconnected solar cells, electrical components, a flat and transparent glass cover that, together, are held within a weatherproof frame. Each panel will consist of a number of solar cells that are laid flat to form a plane and that are held between the backing plate and the glass cover. Tension is often achieved through use of the frame holding all the elements together and in place. Solar cells are often interconnected on a "string" and such that each string may form a row of solar cells in a solar panel. The solar cell strings, or individual solar cells, may be fixed to each other or a substrate through means of adhesives and in such a way that a solar panel's components become a monolithic structure.

A typical solar panel solution for a residence, or for a commercial purpose, will be a set of solar panels referred to as an array. Depending on specific site conditions, the arrangement of multiple solar panels may require hardware fasteners to be used on structures and such mounting may require roof penetrations to help secure each panel safely and permanently as the given life of a solar panel normally exceeds twenty years. Within the lifetime of the solar panel, or array, individual solar cells, solar panel components or entire solar panels may be affected with various forms of damage and necessitating a choice of solar panel repair or replacement. Often, there is no choice between repair and replacement. Instead, due to the method of solar panel construction explained above, affected, or otherwise damaged, solar panels are typically replaced even though the defect may be an individual component that should be easily replaced and may be of low value. Because of the typical solar panel construction, it is difficult, if not impossible, to make repairs within the panel. To address this issue, and the issue of long-term maintenance, some efforts have been made to address the issue of solar panel repair, especially solar cell repair or replacement, as represented by the following inventions.

U.S. Pat. No. 7,908,348 (Kumar et al; Mar. 15, 2011) teaches us of a dynamic installation and uninstallation system of renewable energy farm hardware. This patent works to address the typical situation of a utility-scale wind farm or solar panel farm that are each developed overtime with multiple installations of turbines, or solar panels (arrays) and, in which, the software system must be re-booted to recognize the additional turbine, or panel, installed. This patent provides for at least one communications device to communicate with a hardware configuration database such that the software does not have to be re-booted. The utility of this patent is to make renewable farm operations more effective and efficient. This patent also works to establish the fact that renewable energy sources require long-term maintenance that may include the repair, or replacement, of individual components such as wind turbines or solar panels but this patent's utility is limited to software related to whole units of solar panels or wind turbines.

U.S. Pat. No. 7,989,729 (Zhao et al; Aug. 2, 2011) teaches us of the detecting and repairing of photovoltaic device defects. This patent identifies an approach to detect and repair shunt defects in solar substrates (cells) by utilizing a process diagnostic module to test the substrate and a repair module that electrically isolates the shunt defect, imaging means to identify the area of defect and that may further dispense an electrically conductive paste to implement a shunt repair. This patent does not claim utilization of this invention at a particular step of production or use, such as at test of solar cells, or at solar panel production or in the field after solar panel installation. However, the ability to efficiently identify and repair shunt defects has obvious utility in any of those situations. This patent further demonstrates the variability of quality of components that may exist in a renewable energy device, such as a solar panel, and the potential need for repair of the panel, or components of the panel, over time. It addresses only one form of potential defect in a solar panel.

U.S. Pat. No. 7,998,760 (Tabe; Aug. 16, 2011) teaches us of a manufacture method for photovoltaic modules including inspection and repair. This patent illustrates a method, during the solar panel production cycle, of identifying a defective solar cell and replacing the entire solar cell before final assembly (production) of the solar panel. With this invention, the typical issue of a fragile solar cell damaged due to pressure experienced during the manufacture (assembly) process is addressed via an alternative method of assembly wherein solar cells are temporarily fixed before test and final set into a solar panel. This invention also has utility in addressing a very real need to provide the highest quality final product (e.g., solar panel). As discussed in this patent, one typical issue addressed by this invention is the additional work and cost created for any repair due to the typical steps of manufacturing a solar panel with its component elements being adhered to one another forming a monolithic device. This patent is limited in its application to the manufacturing cycle and not the long-term care and maintenance of panels.

U.S. Pat. No. 6,617,505 (Shimada; Sep. 9, 2003) teaches us of a solar battery module (solar panel), replacement solar cell and method of replacing solar cell. This patent addresses the potential need to replace one, or more, solar cells in a panel after production of the solar panel. Specifically, this invention provides for the additional spacing around key solar cells within a string of solar cells in a panel to provide ample space for the removal of defective cells and the replacement thereof (including electrical interconnection). This patent recognizes the typical arrangement of solar cells in a solar panel as abutted against each other and providing no space to access and remove a single cell without damaging other cells or requiring the removal of an entire cell string and causing waste in the act. The utility of this patent is to contemplate the future repair of an individual element of a solar panel device, a single solar cell, and to design into the solar panel a means of improving the opportunity for repair. This patent is limited in that it addresses one approach of solar cell replacement and does not address access to the solar cell(s) in order to affect the repair or replacement.

SUMMARY OF THE INVENTION

A solar panel configured with modular parts and means of access to provide for the repair, or replacement, of defective and/or non-defective solar panel parts thus allowing for an installed panel to be retrofitted or upgraded.

The primary objective of the present invention is to reduce the long-term ownership costs of a solar panel, or solar array, by providing an alternative solar panel (device) design that provides for alternative methods of solar panel repair and maintenance as compared to traditional, and contemporary, solar panel designs with fixed components.

The primary advantage of the present invention is to reduce the risk of solar panel ownership by providing a method for the replacement of broken, or damaged, parts within the solar panel.

Yet another advantage of the present invention is that it provides for the upgrade of installed solar panels and arrays to the latest solar cell technology and thus further providing a different set of incentives for residential and business users alike as well as to provide different incentives for installation or other solar providers.

Other objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

DETAILED DESCRIPTION OF THE INVENTION

Figure 1:
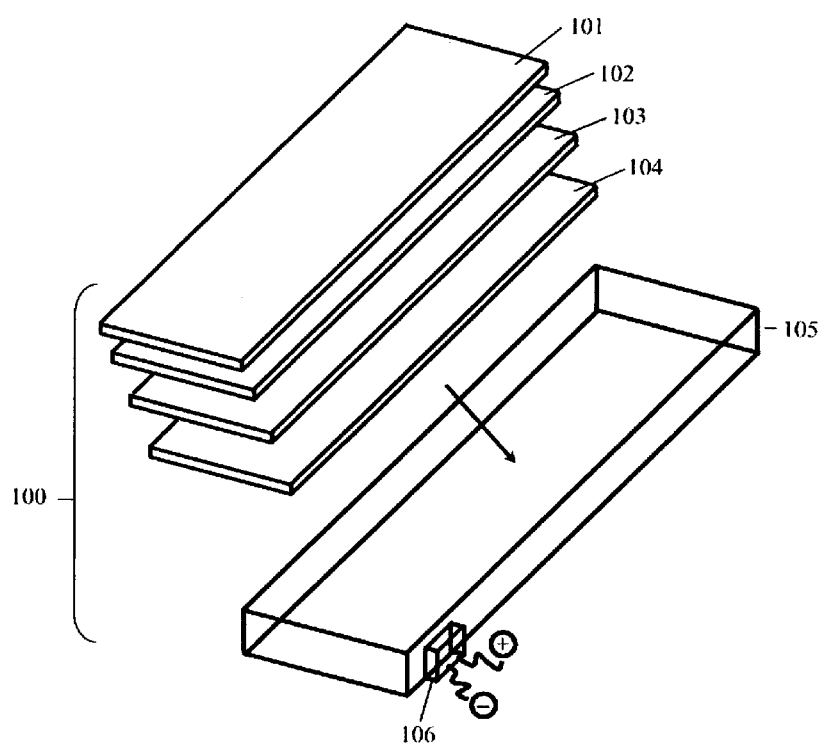
FIG. 1 is a perspective view of a typical solar panel.

Referring now to FIG. 1, a contemporary solar panel 100 is shown and meant to represent a typical, and pre-existing, solar panel design. Solar panel 100 is comprised of transparent cover 101, anti-reflective sheet 102, a layer of solar cells 103 that may be arranged individually or in strings and substrate 104. Elements 101-104 are held in rigid frame 105 and may be understood to be adhered to one another so as to affect a monolithic structure. Box 106 is meant to represent additional electrical components found on a typical solar panel such as a junction box.

Figure 2:
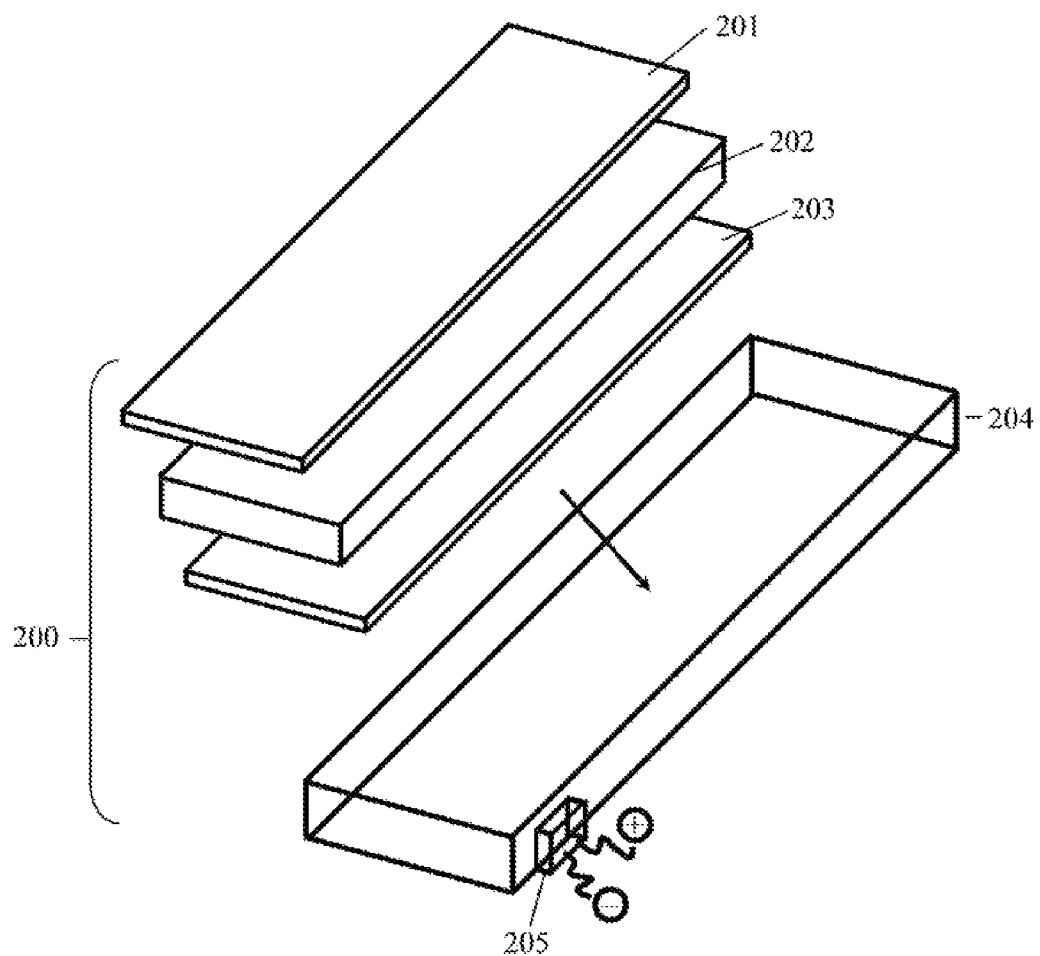
FIG. 2 is a perspective view of the present invention.

Now referring to FIG. 2, that is the first representation of the present invention, a reconfigurable solar panel 200 is comprised of the same essential parts of a contemporary panel 100 shown in FIG. 1. Reconfigurable solar panel 200 is shown with transparent cover 201, a plurality of solar cells in solar cell section 202 and a back substrate 203. Components 201-203 are housed within frame 204 but, as shown in subsequent figures, may be not be adhered, or otherwise permanently fixed into place, within frame 204. Box 205 is meant to represent any electrical component(s) such as a junction box. It should be understood that solar cell section 202 is meant to represent a distinct and separate physical form such as a wire frame, alternate substrate or other physical device to hold the plurality of solar cells.

Figure 3:
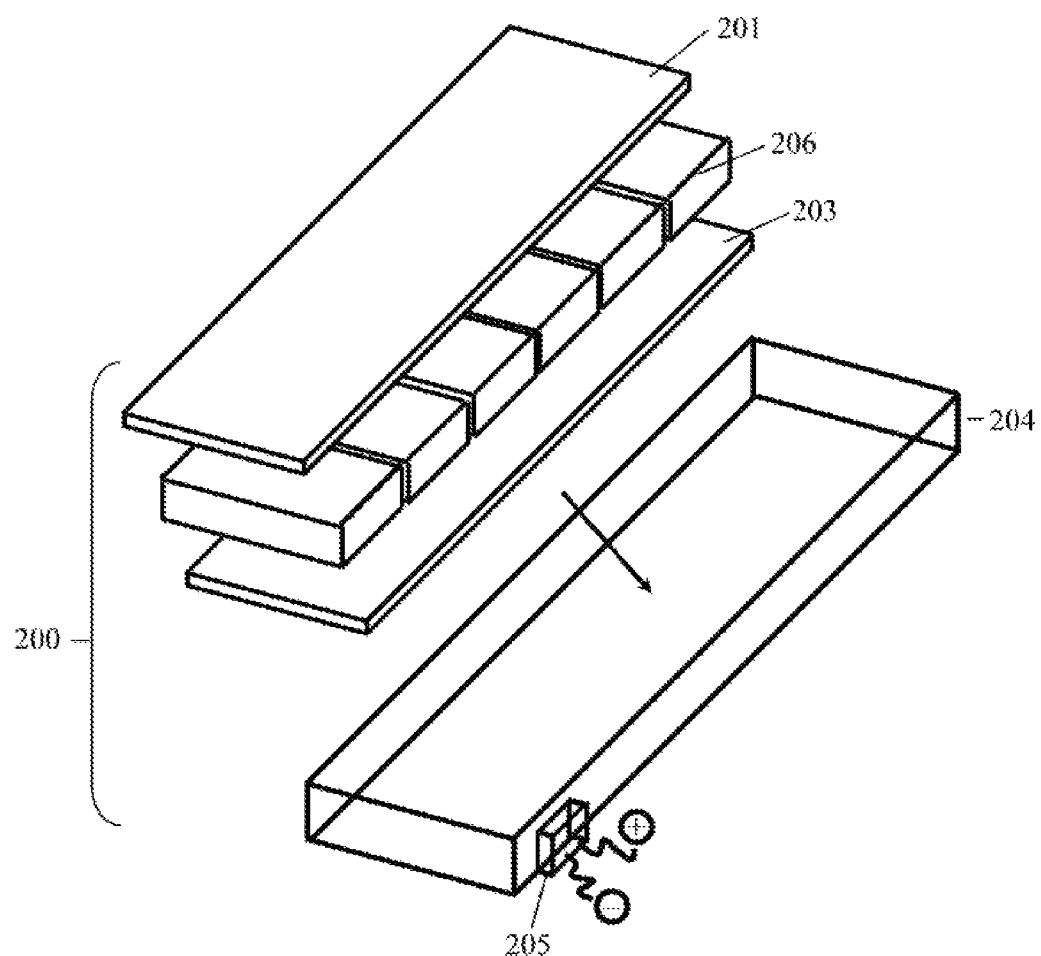
FIG. 3 is a perspective view of an alternative embodiment of the present invention.

Now referring to FIG. 3, reconfigurable solar panel 200 is shown in an alternative embodiment and is comprised of most of the same components as shown in FIG. 2 with transparent cover 201, substrate 203, frame 204 and generic electrical interconnect 205. In FIG. 3, reconfigurable solar panel 200 is now shown with solar cell section 206 and which is meant to represent a plurality of solar cells, such as to be equivalent to solar cell section 202, but that is understood to be grouped in sections such as in strings, modules or grouped individually. It should be further understood that the solar section 206 may be comprised of two, or more, distinct and separate physical forms such as wire frames, alternate substrates or other physical devices to hold the plurality of solar cell strings, modules or individual solar cells.

Figure 4:
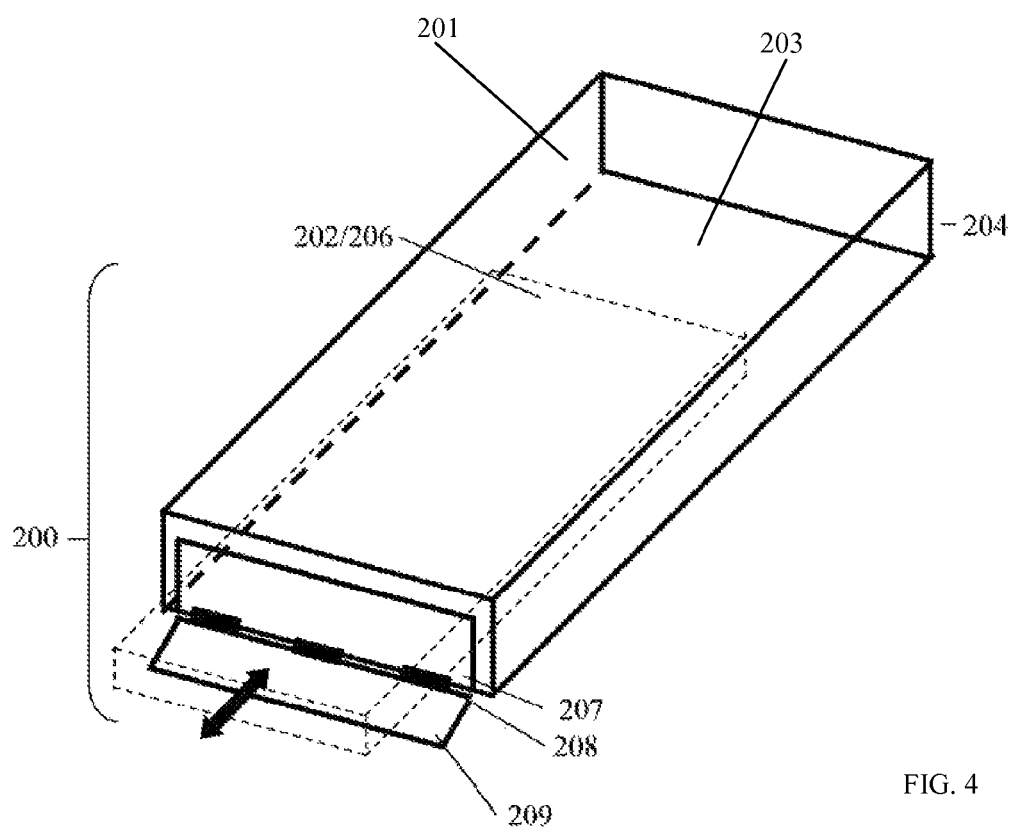
FIG. 4 is a perspective view of a second alternative embodiment of the present invention.

Now referring to FIG. 4, a second alternative, and simplified, version of the present invention is shown with transparent cover 201, substrate 203, frame 204 and solar section 202 (or alternatively 206). In this embodiment of the present invention, frame 204 has been modified from a solid structure to provide for a slot 207 through which solar section 202/206 may be removed and replaced and providing the ability to remove, replace and/or repair solar section 202/206. Frame 204 is further modified to include hinges 208 and door 209 that should be understood to may be fastened to frame 204 allowing for slot 207 to be closed and provide for protection of the solar panel components. It should be understood that slot 207 is meant to represent a slot cut within the boundaries of one side of frame 204.

Figure 5:
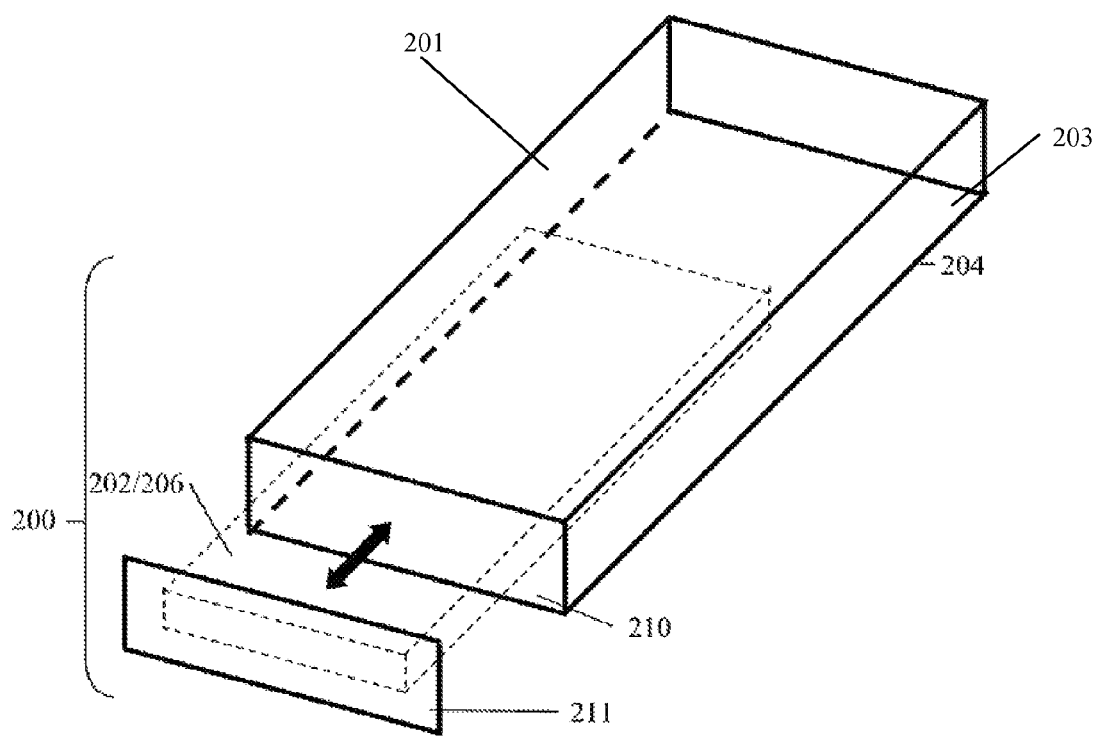
FIG. 5 is a perspective view of a third alternative embodiment of the present invention.

Now referring to FIG. 5, a third alternative, and simplified, version of the present invention is shown with transparent cover 201, substrate 203, frame 204 and solar section 202 (or alternatively 206). In this embodiment of the present invention, frame 204 has been modified from a solid structure to provide for slot 210 through which solar section 202/206 may be removed and replaced and providing the ability to remove, replace and/or repair solar section 202/206. Solar cell section 202/206, being comprised of a physical form, such as a wire frame, that holds the solar cells, is shown in this figure to be connected to panel 211 and wherein panel 211 acts to cover slot 210 and that can be fastened to frame 204 such that slot 210 is sealed. It should be understood that slot 210 is meant to represent a slot the size of one side of frame 204 and not a slot cut within one side of frame 204.

Figure 6:
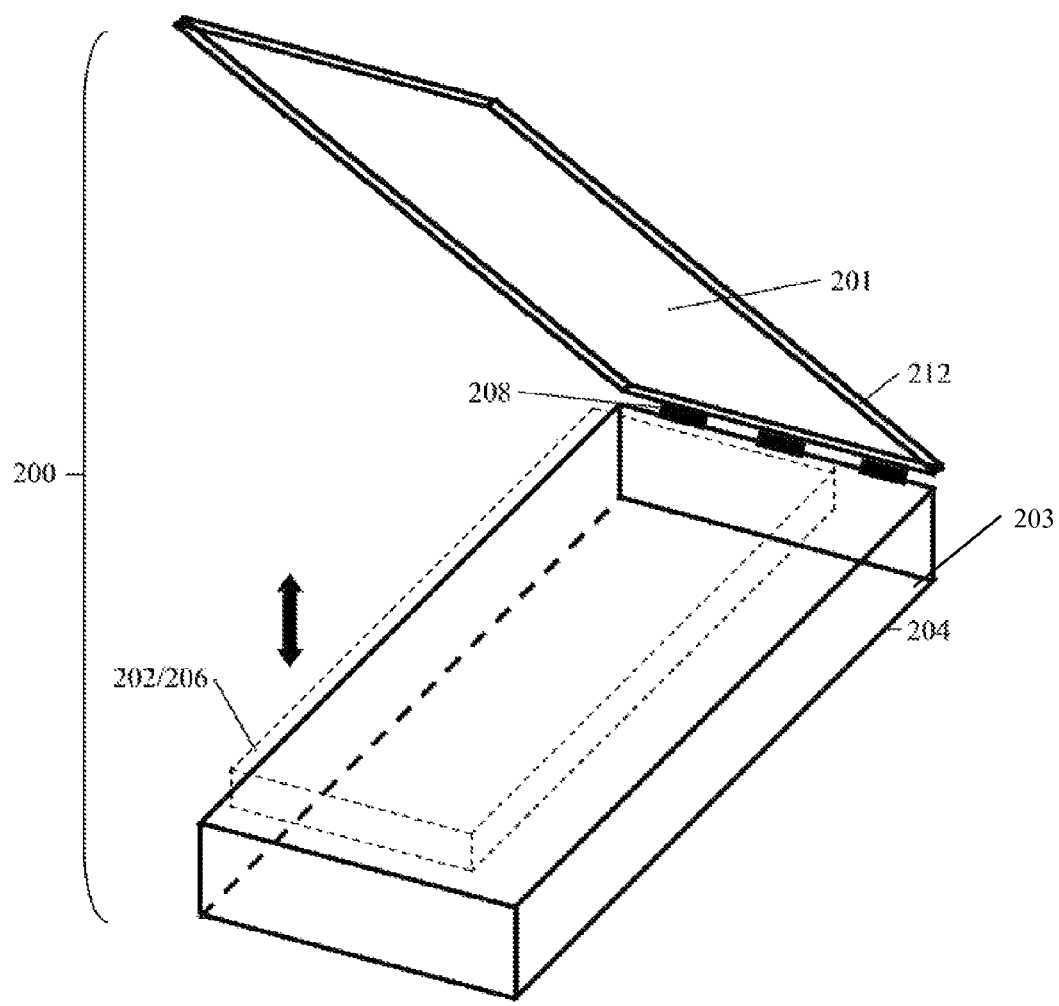
FIG. 6 is a perspective view of a fourth alternative embodiment of the present invention.

Now referring to FIG. 6, a fourth alternative, and simplified, version of the present invention is shown with transparent cover 201, substrate 203, frame 204 and solar section 202

(or alternatively 206). In this embodiment of the present invention, frame 204 has been modified to add hinges 208 that allow for transparent cover 201 to be secured to one side of frame 204 thus allowing for cover 201 to be lifted and allowing solar cell section 202/206 to be lifted from, or inserted back into, reconfigurable solar panel 200 and thus providing the ability to remove, replace and/or repair solar section 202/206. Transparent cover 201 is shown fitted with rigid frame 212 to provide strength and assist in fastening cover 201 to frame 204 and such that reconfigurable solar panel 200 can be sealed.

Figure 7:
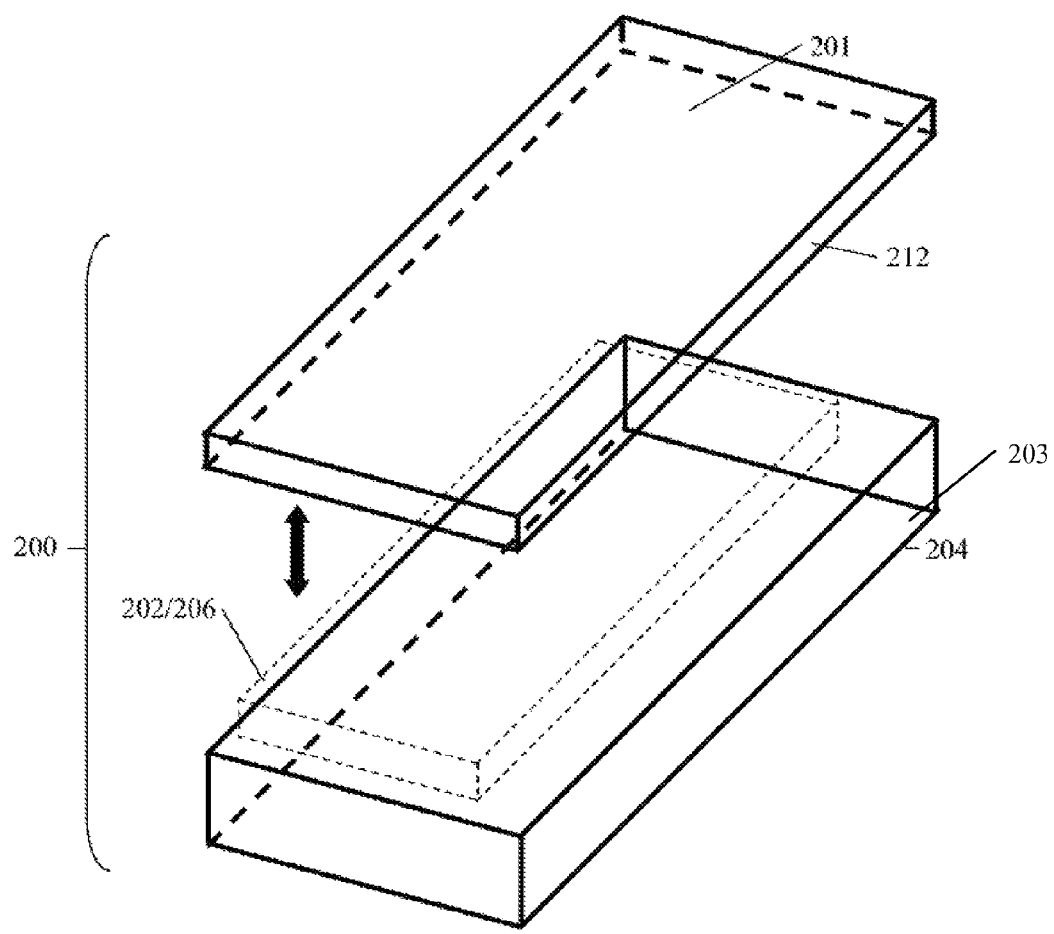
FIG. 7 is a perspective view of a fifth alternative embodiment of the present invention.

Now referring to FIG. 7, a fifth alternative, and simplified, version of the present invention is shown with transparent cover 201, substrate 203, frame 204 and solar section 202 (or alternatively 206). In this embodiment of the present invention, frame 204 has been modified to allow for transparent cover 201 to be lifted from frame 204 entirely and thus allowing access to interior of panel 200 and for the ability to remove, replace and/or repair solar section 202/206. Transparent cover 201 is shown fitted with rigid frame 212 to provide strength and assist in fastening cover 201 to frame 204 and such that reconfigurable solar panel 200 can be sealed.

Figure 8:
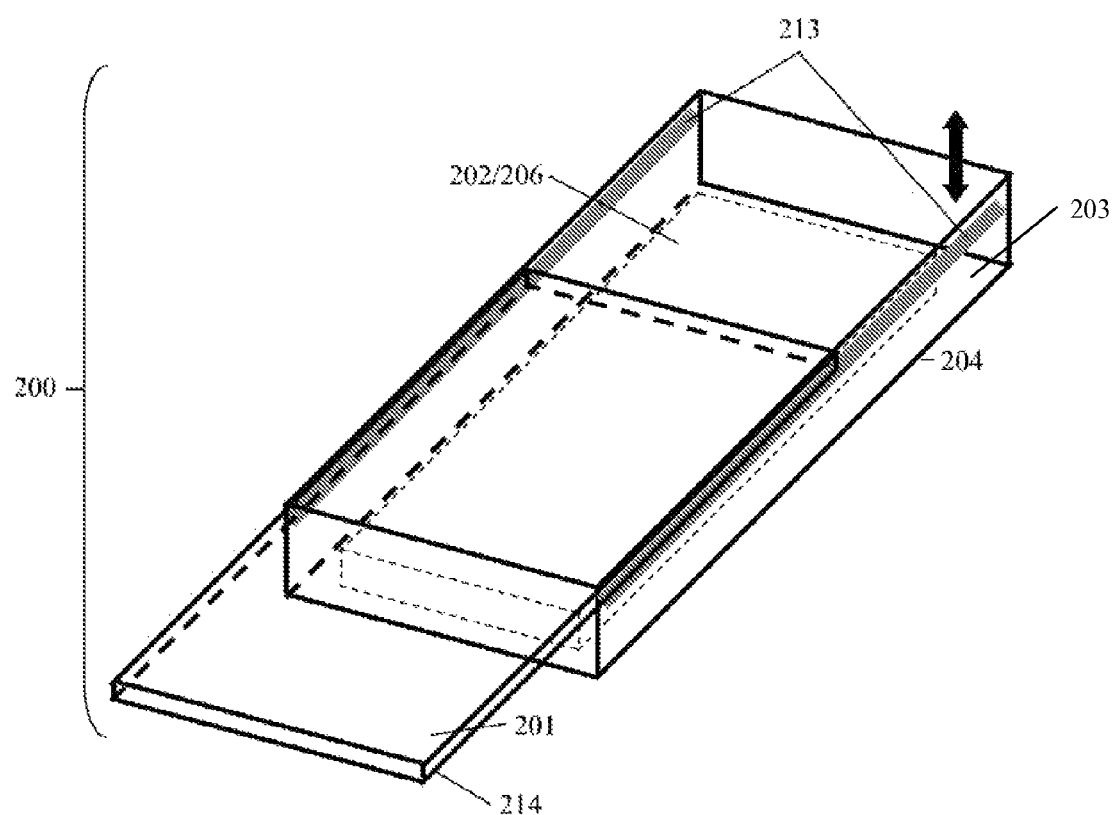
FIG. 8 is a perspective view of a sixth alternative embodiment of the present invention.

Now referring to FIG. 8, a sixth alternative, and simplified, version of the present invention is shown with transparent cover 201, substrate 203, frame 204 and solar section 202 (or alternatively 206). In this embodiment of the present invention, frame 204 has been modified to allow for transparent cover 201 to slide from frame 204 and thus allowing access to interior of panel 200 and for the ability to remove, replace and/or repair solar section 202/206. Frame 204 is modified to include sliding tracks 213 on which transparent cover 201 is guided. Transparent cover 201 is modified to include a track rigid frame 214 that is formed to be paired to tracks 213 and such that tracks 213 and track rigid frame 214, once connected, prevent the lifting of transparent cover 201 but facilitate the sliding of cover 201.

Figure 9:
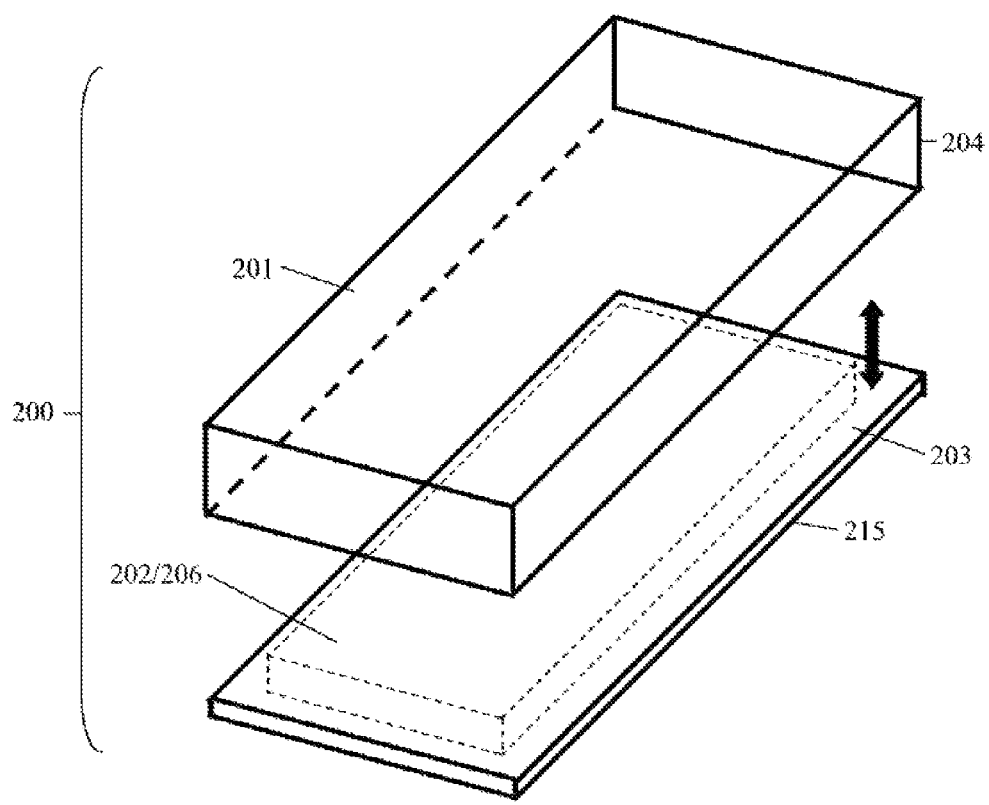
FIG. 9 is a perspective view of a seventh alternative embodiment of the present invention.

Now referring to FIG. 9, a seventh alternative, and simplified, version of the present invention is shown with transparent cover 201, substrate 203, frame 204 and solar section 202 (or alternatively 206). In this embodiment of the present invention, frame 204 has been modified to allow for back substrate 203 to be removed from frame 204 and thus allowing access to interior of panel 200 and for the ability to remove, replace and/or repair solar section 202/206. Solar cell section 202/206 may alternatively be placed onto substrate 203 or fixed to substrate 203. Substrate 203 is further shown to have flange, or other means, 215 that is included to aid in the fastening of substrate 203 to frame 204 and providing for reconfigurable solar panel 200 to be sealed. As shown, transparent cover 201 is fixed to frame 204. However, for the purposes of understanding, transparent cover 201 may be modified as represented in FIG. 6 through FIG. 8.

The advantages of the present invention include, without limitation, the ability to repair, replace and/or upgrade the various components of the solar panel including, with emphasis, the photovoltaic (solar) cells held within the solar panel enclosure.

In broad embodiment, the present invention is a solar panel comprised of two primary assemblies. The first assembly is the solar panel enclosure that is comprised, minimally, of the frame, substrate and transparent cover. The second assembly is an energy core comprised of a plurality of photovoltaic cells that may be understood to be connected in series, parallel, or in combination of series and parallel and mounted to a substrate, wire frame or other means and where this second assembly can be removed in parts and/or as a whole.

DESCRIPTION OF THE PREFERRED EMBODIMENTS

Best Modes for Carrying Out the Invention

The present invention may be used as a solar (photovoltaic) panel, or device, capable of producing electricity through the photovoltaic effect that may be configured as a small solar panel, or device, a larger solar panel and/or used in different combinations to form a solar array.

As a preferred embodiment, the present invention is a solar panel comprised of an energy core represented by a plurality of solar cells that are physically and electrically connected and mounted in a manner to easily replace one, or more, of the solar cells and a rigid frame with at least one side of which is transparent and where the frame is not a permanent enclosure but an accessible enclosure and where the two components can be easily interconnected, such as through plugs, to provide the electricity generated from the energy cores to flow from the energy cores and to enclosure and to other components, an array and/or electrical load(s).

The present invention may be utilized as a substitute to and improvement over traditional fixed solar panels whose components are often fixed or adhered and thus preventing the easy access and repair of damaged components and thus necessitating the potential replacement of an entire panel for the damage of a single cell or a single component such as the transparent cover and where such damage may occur at any point during the (approximate) twenty year life of the traditional solar panel.

INDUSTRIAL APPLICABILITY

The invention is further illustrated by the following non-limiting examples.

Example 1

The present invention may act as a repairable solar panel. For example, with traditional solar panels, and for comparison, a solar panel that is struck by a large hailstone may fracture a single solar cell reducing not only the electrical capacity of that solar cell but, depending on the location of that cell within a string of solar cells, if not also the location within the whole panel, may act to throttle the electricity delivered by the solar cell string and/or whole panel and necessitating the repair or replacement of the panel. As a traditional solar panel with fixed solar cells in a thin, adhered, solar panel structure, only the replacement of the whole solar panel, at a cost of hundreds of dollars can be made due to the fact that an attempted replacement of the single damaged solar cell will result in the damage, if not destruction, of the rest of the panel. Further, the damaged solar panel that is replaced becomes part of a waste and landfill issue.

By contrast, the present invention may be subject to similar issues of long-term damage and, for the purposes of this example, may be also struck by a large hailstone resulting in the fracture of a single solar cell. Because the present invention is configured to provide access to the energy core, a repairman can visit the installation site with the replacement part(s) and proper tools, open the present invention solar panel and diagnose the issue. On identification that the one solar cell needs replacement, extract the energy core from the solar panel enclosure, replace the solar cell and return the now fully-functioning energy core back to the solar panel enclosure. By contrast, the cost of the replacement part is well under one hundred dollars and the time to make the replacement, the cost of the repairman, is also substantially less.

Example 2

The present invention may act as an upgradeable solar panel. By contrast to current solar panel designs that require the replacement of an entire installed solar panel, the present invention solar panel is configured of a solar panel enclosure that can be installed onto various surfaces such as a roof. Once installed on a roof, the solar panel enclosure can act as a permanent installation fixed onto the roof and wired to the solar panel array and/or electrical loads.

For example, a homeowner has a small array of the present invention solar panels installed on her roof. The small array consists of four panels each producing 250 Watts for a total array of 1 Kilowatt. Each solar panel is contains only solar cells with an 11% efficiency. The installation is made in Year One. After three years, in Year Four, the homeowner has a room built adjoining the rest of the house and driving the need for increased electricity. The homeowner does not have the space on the roof to add any additional solar panels. Instead, due to the reconfigurable and upgradeable elements of the present invention, the homeowner can opt to update the energy core portion of the present invention solar panels.

The providing solar panel company can offer the homeowner new energy cores that contain only 14% efficiency solar cells of the same dimensions of the prior solar cells and resulting in solar panels providing 318 Watts of electricity for a total array of 1.27 Kilowatts. The change is made by repairmen that opens the solar panel enclosure of each panel, removes the old energy cores and inserts the new energy cores. The same solar panel footprint is maintained. The cost of the new energy cores is less than the cost of whole new panels and the effort to replace the energy cores is less than the cost for the de-installation and re-installation of whole new solar panels.

Example 3

The present invention may act as a solar panel whose non-photovoltaic components are repairable and/or replaceable. For example, a homeowner has the present invention solar panel installed on his barn roof. After several seasons, he notices the panel is not generating as much electricity as before. On inspection, he notes the transparent cover has a haze that is blocking light from entering the device.

A repairman is called and comes to the site with a replacement transparent cover. The repairman, with the proper tools and training, accesses the solar panel and removes the hazy transparent cover. He then mounts the new, replacement, transparent cover and assures it weatherproof seal returning the solar panel it is original performance level.

The preceding examples can be repeated with similar success by substituting the generically or specifically described parameters and/or operating conditions of this invention for those used in the preceding examples.

While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiment, method, and examples, but by all embodiments and methods within the scope and spirit of the invention as claimed.

I claim:

1. A reconfigurable photovoltaic panel comprising: shell components that include at least one transparent side, a mounting substrate and frame; internal components that include a plurality of solar cells and any means to mount the solar cells; a transparent cover that is operable such that it can be opened, repaired, replaced, upgraded and closed through the use of a hinge connected to one end of the transparent cover and one end of the frame; wherein the operable transparent cover provides access to the interior of the panel for repair, replacement or upgrading of other panel components.

2. A reconfigurable photovoltaic panel comprising: shell components that include at least one transparent side, a mounting substrate and frame; internal components that include a plurality of solar cells and any means to mount the solar cells to the mounting substrate; the mounting substrate is operable such that it can be opened, repaired, replaced, upgraded and closed through any uses of a hinge, sliding mechanism or fastening system which separates it from a transparent cover; wherein the operable mounting substrate provides access to the interior of the panel for repair, replacement or upgrading of other panel components.

3. A reconfigurable photovoltaic panel comprising: shell components that include at least one transparent side, a mounting substrate and an external frame; internal components that include a plurality of solar cells and any means to mount the solar cells to the mounting substrate; the external frame containing at least one slot and where each slot is sealable by a transparent cover that is operable such that it can be opened, repaired, replaced, upgraded and closed through any uses of a hinge, sliding mechanism or fastening system; wherein the operable transparent cover provides access to the interior of the panel for repair, replacement or upgrading of other panel components.

4. A reconfigurable photovoltaic panel comprising: shell components that include at least one transparent side, a mounting substrate and frame; internal components that include a plurality of solar cells and any means to the mount solar cells to an internal physical system; the panel is configured such that the solar cells can be manipulated for the purpose of repair, replacement and upgrading through the use of a sliding mechanism; the sliding mechanism comprising tracks on the frame and mating tracks on a transparent cover, once connected, prevents the lifting of the transparent cover; where an electrical interconnection system and the internal physical system are each connected to two or more solar cell group combinations.

* * * * *